United States Patent
Lau et al.

(10) Patent No.: US 9,057,853 B2
(45) Date of Patent: Jun. 16, 2015

(54) APPARATUS HAVING AN EMBEDDED 3D HYBRID INTEGRATION FOR OPTOELECTRONIC INTERCONNECTS

(75) Inventors: Hon Shing Lau, Palo Alto, CA (US); Shi-Wei Lee, Hong Kong (CN); Matthew Ming Fai Yuen, Hong Kong (CN); Jingshen Wu, Hong Kong (CN); Chi Chuen Lo, Hong Kong (CN); Haibo Fan, Hong Kong (CN); Haibin Chen, Hong Kong (CN)

(73) Assignee: The Hong Kong University of Science and Technology, Kowloon (HK)

( * ) Notice: Subject to any disclaimer, the term of this patent is extended or adjusted under 35 U.S.C. 154(b) by 1374 days.

(21) Appl. No.: 12/709,279

(22) Filed: Feb. 19, 2010

(65) Prior Publication Data
US 2010/0215314 A1 Aug. 26, 2010

Related U.S. Application Data

(60) Provisional application No. 61/202,348, filed on Feb. 20, 2009.

(51) Int. Cl.
*G02B 6/43* (2006.01)
*H05K 1/02* (2006.01)
*G02B 6/42* (2006.01)

(52) U.S. Cl.
CPC ........ *G02B 6/43* (2013.01); *H05K 2201/10121* (2013.01); *H05K 1/0274* (2013.01); *G02B 6/4214* (2013.01)

(58) Field of Classification Search
USPC .......................................................... 385/14
See application file for complete search history.

(56) References Cited

U.S. PATENT DOCUMENTS

| | | | |
|---|---|---|---|
| 5,054,872 A | 10/1991 | Fan et al. | |
| 6,057,601 A | 5/2000 | Lau et al. | |
| 6,243,509 B1 | 6/2001 | Chen | |
| 6,456,766 B1 | 9/2002 | Shaw et al. | |
| 6,477,286 B1 * | 11/2002 | Ouchi | ............................. 385/14 |
| 6,707,140 B1 * | 3/2004 | Nguyen et al. | ................ 257/686 |
| 6,846,725 B2 | 1/2005 | Nagarajan et al. | |
| 6,907,151 B2 | 6/2005 | Yunnus | |

(Continued)

OTHER PUBLICATIONS

Hoe, G., et al., "Effect of TSV Interposer on the Thermal Performance of FCBGA Package", *IEEE Proceedings of Electronics Packaging and Technology Conference*, Singapore, Dec. 2009, pp. 778-786.

(Continued)

*Primary Examiner* — Ryan Lepisto
*Assistant Examiner* — Erin Chiem
(74) *Attorney, Agent, or Firm* — Leydig, Voit & Mayer, Ltd.

(57) ABSTRACT

An optoelectronic apparatus is described herein, including a transmitter, a receiver, and an optical waveguide, all of which are embedded in a PCB. The transmitter includes a laser generator and other circuits for generating electrical and optical signals, which are transmitted through the waveguide to the receiver. The receiver includes circuits and detectors for detecting and converting the optical signals to electrical signals. The circuit and optical components of the transmitter and receiver are integrated in 3D hybrid chip sets where the chip components are stacked in a 3D structure. Because all of the circuit and optical components are embedded in the PCB, the apparatus is made very compact and suitable for implementation in portable products.

18 Claims, 8 Drawing Sheets

(56) References Cited

U.S. PATENT DOCUMENTS

| | | | |
|---|---|---|---|
| 6,924,551 | B2 | 8/2005 | Rumer et al. |
| 7,044,658 | B1* | 5/2006 | Grung et al. ................... 385/92 |
| 7,062,116 | B2* | 6/2006 | Ouchi ............................ 385/14 |
| 7,263,248 | B2 | 8/2007 | Windover |
| 7,317,256 | B2 | 1/2008 | Williams et al. |
| 7,373,033 | B2 | 5/2008 | Lu et al. |
| 2005/0089264 | A1 | 4/2005 | Johnson et al. |
| 2006/0009029 | A1 | 1/2006 | Hua et al. |
| 2006/0046432 | A1 | 3/2006 | Sankarapillai et al. |
| 2009/0032928 | A1 | 2/2009 | Chiang et al. |

OTHER PUBLICATIONS

Hu, G., et al. "Package technology to address the memory bandwidth challenge for tera-scale computing," *INTEL Technol. J.* vol. 11, 2007, pp. 197-206.

Khan, N., et al., "Development of 3D Silicon Module with TSV for System in Packaging", *IEEE Proceedings of Electronic, Components & Technology Conference*, Orlando, FL, May 27-30, 2008, pp. 550-555.

Lau, J. H., "TSV Manufacturing Yield and Hidden Costs for 3D IC Integration", *IEEE Proceedings of Electronic, Components & Technology Conference*, Las Vegas, NV, Jun. 2010, pp. 1031-1041.

Lau, J. H., "Critical Issues of 3D IC Integrations", *Proceedings of IMAPS International Symposium on Microelectronics*, San Jose, CA, Nov. 2009, pp. 585-592. Also, to be published in the *IMAPS Transactions, Journal of Microelectronics and Electronic Packaging*.

Lau, J. H., "Design and Process of 3D MEMS Packaging", *Proceedings of IMAPS International Symposium on Microelectronics*, San Jose, CA, Nov. 2009, pp. 1-9. Also, to be published in the IMAPS Transactions, Journal of Microelectronics and Electronic Packaging.

Lau, J. H., "State-of-the-art and Trends in 3D IC Integration", *Chip Scale Review* Mar./Apr. 2010 pp. 22-28.

Lau, J. H., et al., "Thermal and Mechanical Evaluations of a Cost-Effective Plastic Ball Grid Array Package", ASME Transactions, *Journal of Electronic Packaging*, vol. 119, Sep. 1997, pp. 208-212.

Lau, J. H., et al., "Cooling Assessment and Distribution of Heat Dissipation of A Cavity Down Plastic Ball Grid Array Package—NuBGA", *IMAPS Transactions, International Journal of Microelectronics & Electronic Packaging*, vol. 21, No. 1, 1998, pp. 20-28.

Lau, J. H., et al., "Electrical Design of a Cost-Effective Thermal Enhanced Plastic Ball Grid Array Package—NuGBA", *IEEE Transactions on CPMT*, Part B, vol. 21, No. 1, Feb. 1998, pp. 35-42.

Lau, J. H., "Design, Manufacturing, and Testing of a Novel Plastic Ball Grid Array Package", *Journal of Electronics Manufacturing*, vol. 9, No. 4, Dec. 1999, pp. 283-291.

Lee, Ricky, et al., "3D LED and IC Wafer Level Packaging", *Microelectronics International*, vol. 27., No. 2., 2010—pp. 98-105.

Lau, J. H., "Solder Joint Reliability of Flip Chip and Plastic Ball Grid Array Assemblies Under Thermal, Mechanical, and Vibration Conditions", *IEEE Transaction on CPMT*, Part B, vol. 19, No. 4, pp. 728-735, Nov. 1996.

Lau, J. H., et al., "Nonlinear Analysis of Full-Matrix and Perimeter Plastic Ball Grid Array Solder Joints", *ASME Transactions, Journal of Electronic Packaging*, vol. 119, Sep. 1997, pp. 163-170.

Lau, J. H., et al., "Solder Joint Reliability of Cavity-Down Plastic Ball Grid Array Assemblies", *Journal of Soldering & Surface Mount Technology*, vol. 10, No. 1, Feb. 1998, pp. 26-31.

Selvanayagam, C., et al., "Nonlinear Thermal Stress/Strain Analysis of Copper Filled TSV (Through Silicon Via) and Their Flip-Chip Microbumps", *IEEE Transactions in Advanced Packaging*, vol. 32, No. 4, Nov. 2009, pp. 720-728.

Holden, H., "The Developing Technologies of Integrated Optical Waveguides in Printed Circuits", *Circuit World*, vol. 29, No. 4, pp. 42-50, 2003.

Yu, A., et al., "Fabrication of Silicon Carriers with TSV Electrical Interconnections and Embedded Thermal Solutions for High Power 3-D Package", *IEEE Proceedings of Electronic, Components & Technology Conference*, vol. 32, No. 3, Sep. 2009, 566-571.

Lau, J. H., et. al, "Creep of Sn-(3.5-3.9)wt%Ag-(O.5-0.8)wt%Cu Lead-Free Solder", in *Micromaterials and Nanomaterials*, Edited by B. Michel, Fraunhofer Institute, IZM, Berlin, 2004, pp. 54-62.

Lau, J.H., "TSV and other Key Enabling Technologies for 3D IC Integrations", Professional Development Course given at *IEEE Electronic & Components Technology Conference*, San Diego, CA May 2009.

Kok EE Tan, et al., "Creep Properties of SACC Lead-Free Solder", *IEEE Proceedings of Electronics Packaging Technology Conference*, Dec. 2008, pp. 521-526.

Lau, J. H., "Design and Process of 3D MEMS Packaging", *IMAPS Proceedings*, Nov. 2009, pp. 1-9.

Lee, S.W.R., et al. "Design for Plastic Ball Grid Array Solder Joint Reliability", *Circuit World*, vol. 23., No. 2, pp. 11-13, Jan. 1997.

Lau, J. H., et al., "Effects of TSV (Through Silicon Via) Interposer/Chip on the Thermal Performances of 3D IC Packaging", *ASME Paper No. IPACK2009-89380*, San Francisco, CA, Jul. 2009, pp. 67-74.

Lau, J. H., et al., "Reliability of Sn3wt%AgO.5wt%CuO.019wt%Ce (SACC) Solder Joints", *IEEE Proceedings of Electronic, Components & Technology Conference*, May 2009, pp. 415-422.

Chen, Y. M., et al., "10Gbps Multi-Mode Wavequide for Optical Interconnect", *IEEE Proceedings of Electronic Components and Technology Conference*, pp. 1739-1743, 2005.

Shioda T., "Recent Progress and Potential Markets for Optical Circuit Boards", *IEEE Proceedings of Polytronic Conference*, pp. 1-3.2007.

Lau, J.H., et.al., "Design and Analysis of 3D Stacked Optoelectronics on Optical Printed Circuit Boards", to be published in *IEEE Trans. on Advanced Packaging*.

Glebov, A. L., et al., "Direct Attach of Photonic Components on Substrates with Optical Interconnects", *IEEE Photonics Technology Letters*, vol. 19, No. 8, pp. 547-549, Apr. 15, 2007.

Wang, L., et al., "Thin Film Optical Waveguide and Optoelectronic Device Integration for Fully Embedded Board Level Optical Interconnects" *Proceedings SPIE of Photonics Packaging and Integration IV*, vol. 5556, pp. 1-13, 2004.

Pong, Brian Lee Sik, et al., "Prototype Development for Chip-Chip Interconnection by Multimode Waveguide", *IEEE Proceedings of Electronic Packaging and Technology Conference*, pp. 488-491, 2005.

Schow, C. L., et al., "160-Gb/s, 16-Channel Full-Duplex, Single-Chip CMOS Optical Transceiver", *Proceedings of OThG4*, 2007, © OSA 1-55752-830-6 (3 pages).

Mikawa, T., et al., "Implementation of Active Interposer for High-Speed and Low-Cost Chip Level Optical Interconnects", *IEEE Journal of Selected Topics in Quantum Electronics*, vol. 9, No. 2, pp. 452-459, Mar./Apr. 2003.

Pugliano, Nick, et al., "Progress Toward the Development of Manufacturable Integrated Optical Data Buses", *SPIE Proceedings of Photonics Packaging and Integration IV*, vol. 5358., pp. 71-79, 2004.

Hiramatsu, S., et al., "Optical Backplane Connectors Using Three-Dimensional Waveguide Arrays", *IEEE Journal of Lightwave Technology*, vol. 25, No. 9, pp. 2776-2782, Sep. 2007.

Tang, G., et al., "Integrated Liquid Cooling Systems for 3-D Stacked TSV Modules",*IEEE Transactions on Components and Packaging Technologies*, vol. 33, No. 1, Mar. 2010, pp. 184-195.

Dellmann, et al., "120 Gb/s Optical Card-to-Card Interconnect Link Demonstrator with Embedded Waveguides", *IEEE Proceedings of Electronic Components and Technology Conference*, pp. 1288-1293, 2007.

Doany, Fuad E., et al., "300-Gb/s 24-Channel Bidirectional Si Carrier Transceiver Optochip for Broad Interconnects", *Electronic Components and Technology Conference, IEEE*, pp. 238-243, 2008.

Shiah, Lim Li, et al., "Optimization and Characterization of Flexible Polymeric Optical Waveguide Fabrication Process for Fully Embedded Board-Level Optical Interconects", *IEEE, 10th Electronics Packaging Technology Conference 2008*, pp. 1114-1120.

Lim, Teck Guan, et al., "Demonstration of High Frequency Data Link on FR4 Printed Circuit Board Using Optical Waveguides",*IEEE, Electronic Components and Technology Conference*, pp. 1268-1274, 2007.

(56) References Cited

OTHER PUBLICATIONS

Lau, J., et al., "Effect of Heat-Spreader Sizes on Thermal Performance of Large Cavity-Down Plastic Ball Grid Array Packages", *Journal of Electronic Packaging*, vol. 121, No. 4, Dec. 1999, pp. 242-248.
Ramana, Pamidighantam V., et al., "Bi-Directional Optical Communication at 10 Gb/s on FR4 PCB using reflow Solderable SMT transceiver", *IEEE/ECTC Proceedings*, May 2008 (7 pages).
Chai, J.Y.Y., et al., "Electrical Interconnect design Optimization for Fully Embedded Board-Level Optical Interconnects", *IEEE/EPTC Proceedings*, Dec. 2008, p. 1-5.
Lau, J. H., "*State-of-the-art and Trends in 3D IC Integration and WLP*", Professional Development Course given at IEEE Electronic & Components Technology Conference, Las Vegas, NV, Jun. 2010.
Lau, J.H., et al., "Low-Cost Thermal Electrical Enhanced Plastic Ball Grid Array Package—NuBGA", *Microelectronics International*, 1999.
Guidotti, Daniel, et al., "*Edge Viewing Photodectors for Strictly In-Plane Lighwave Circuit Integration and Flexible Optical Interconnects*", IEEE, Electronic Components and Technology Conference, 2006, pp. 782-.
Liang, C.T.W. et al., "Fabrication and Optimization of the 45° Micromirrors for 3-D Optical Interconnections" *IEEE/EPTC Proceedings*, Dec. 2009.
Lau, J.H., "Flip Chip Technology", McGraw-Hill, New York, NY 1995.
Lau,J.H., et al., "Electronics Manufacturing with Lead-Free, Halogen Free, and Adhesive Materials", *McGraw-Hill*, New York, NY 2003.
Lau, J.H., Reliability of RoHs Complaint 2D & 3D IC Interconnects, to be published by *McGraw-Hill*.
Lau, J.H., et al., "Advanced MEMS Packaging", *McGraw-Hill*, New York, NY 2010.
Lau, J.H., et al., "Microvias for Low Cost, High Density Interconnects", *McGraw- Hill*, New York, NY 2001.
Lau, J.H., "Ball Grid Array Technology", *McGraw-Hill*, New York, NY 1995.
Lau, J. H., Low-Cost Flip Chip Technology, *McGraw-Hill*, New York, NY, 2000.
Andry et al., "Fabrication and characterization of robust through-silicon vias for silicon-carrier applications," IBM J. Res. & Dev., 52 (6): 571-581 (Nov. 2008).
Chai et al., "Electrical interconnect design optimization for fully embedded board-level optical interconnects," IEEE 2008 Electronic Components and Technology Conference (ECTC 2008), 1-5 (May 27-30, 2008).
Chang et al., "Fabrication of fully embedded board-level optical interconnects and optoelectronic printed circuit boards," IEEE 2009 11th Electronics Packaging Technology Conference (2009 EPTC), 1-4 (Dec. 9-11, 2009).
Chen et al., "C2W bonding method for MEMS applications," IEEE 2008 10th Electronics Packaging Technology Conference (2008 EPTC), 1283-1287 (Dec. 9-12, 2008).
Choi et al., "Development of low temperature bonding using in-based solders," IEEE 2008 Electronic Components and Technology Conference (2008 ECTC), 1294-1299 (May 27-30, 2008).
Choi et al., "Development of novel intermetallic joints using thin film indium based solder by low temperature bonding technology for 3D IC stacking," IEEE 2009 Electronic Components and Technology Conference (ECTC 2009), 333-338 (May 26-29, 2009).
Doany et al., "300-Gb/s 24-channel bidirectional Si carrier transceiver optochip for board-level interconnects," IEEE 2008 Electronic Components and Technology Conference (2008 ECTC), 238-243 (May 27-30, 2008).
Ho et al., "High RF performance TSV silicon carrier for high frequency application," IEEE 2008 Electronic Components and Technology Conference (2008 ECTC), 1946-1952 (May 27-30, 2008).
Ishii et al., "SMT-compatible large-tolerance 'OptoBump' interface for interchip optical interconnections," IEEE Transactions on Advanced Packaging, 26 (2): 122-127 (May 2003).

Khan et al., "3D Packaging with Through Silicon Via (TSV) for electrical and fluidic interconnections," IEEE 2009 Electronic Components and Technology Conference (ECTC 2009), 1153-1158 (May 26-29, 2009).
Khong et al., "A novel method to predict die shift during compression molding in embedded wafer level package," IEEE 2009 Electronic Components and Technology Conference (ECTC 2009), 535-541 (May 26-29, 2009).
Kumar et al., "Evaluation of stresses in thin device wafer using piezoresistive stress sensor," IEEE 2008 10th Electronics Packaging Technology Conference (2008 EPTC), 1270-1276 (Dec. 9-12, 2008).
Kumar et al., "Wafer level embedding technology for 3D wafer level embedded package," IEEE 2009 Electronic Components and Technology Conference (ECTC 2009), 1289-1296 (May 26-29, 2009).
Lau et al., "Design and analysis of 3D stacked optoelectronics on optical printed circuit boards," Photonics Packaging, Integration, and Interconnects VIII (Glebov et al., eds.), Proceedings vol. 6899 (Feb. 8, 2008).
Lau et al., "Failure analyses of 3D SiP (System-in-Package) and WLP (Wafer-Level Package) by finite element methods," 16th IEEE International Symposium on the Physical and Failure Analysis of Integrated Circuits (IPFA 2009), 1-8 (Jul. 6-10, 2009).
Lau et al., "Thermal management of 3D IC integration with TSV (Through Silicon Via," IEEE 2009 Electronic Components and Technology Conference (ECTC 2009), 633-640 (May 26-29, 2009).
Lee et al., "Bonding interface materials evolution of intermediate In/Ag layers for low temperature fluxless solder based MEMS wafer level packaging," IEEE 2008 International Conference on Electronic Materials and Packaging (2008 EMAP), 216-219 (Oct. 22-24, 2008).
Liang et al., "Fabrication and optimization of the 45° micro-mirrors for 3-D optical interconnections," IEEE 2008 10th Electronics Packaging Technology Conference (2008 EPTC), 1-6 (Dec. 9-12, 2008).
Lim et al., "Demonstration of high frequency data link on FR4 Printed Circuit Board using optical waveguides," IEEE 2008 Electronic Components and Technology Conference (2008 ECTC) (May 27-30, 2008).
Lim et al., "Demonstration of high quality and low loss millimeter wave passives on embedded wafer level packaging platform (EMWLP)," IEEE 2009 Electronic Components and Technology Conference (ECTC 2009), 508-512 (May 26-29, 2009).
Lim et al., "Process development and reliability of microbumps," IEEE 2008 10th Electronics Packaging Technology Conference (2008 EPTC), 367-372 (Dec. 9-12, 2008).
Premachandran et al., "A novel, wafer-level stacking method for low-chip yield and non-uniform, chip-size wafers for MEMS and 3D SIP applications," IEEE 2008 Electronic Components and Technology Conference (2008 ECTC), 314-318 (May 27-30, 2008).
Premachandran et al., "Influence of optical probe packaging on a 3D MEMS scanning micro-mirror for optical coherence tomography (OCT) applications," IEEE 2008 Electronic Components and Technology Conference (2008 ECTC), 829-833 (May 27-30, 2008).
Ramana et al., "Bi-directional Optical communication at 10 Gb/s on FR4 PCB using reflow solderable SMT transceiver," IEEE 2008 Electronic Components and Technology Conference (2008 ECTC), 1-7 (May 27-30, 2008).
Schares et al., "Terabus: terabit/second-class card-level optical interconnect technologies," IEEE Journal of Selected Topics in Quantum Electronics, 12 (5): 1032-1044 (Sep. 2006).
Sekhar et al., "Effect of wafer back grinding on the mechanical behavior of multilayered low-k for 3D-stack packaging applications," IEEE 2008 Electronic Components and Technology Conference (2008 ECTC), 1517-1524 (May 27-30, 2008).
Selvanayagam et al., "Nonlinear thermal stress/strain analyses of copper filled TSV (through silicon via) and their flip-chip microbumps," IEEE 2008 Electronic Components and Technology Conference, 1073-1081 (May 27-30, 2008).
Sharma et al., "Embedded wafer level packages with laterally placed and vertically stacked thin dies," IEEE 2009 Electronic Components and Technology Conference (ECTC 2009), 1537-1543 (May 26-29, 2009).
Shiah et al., "Optimization and characterization of flexible polymeric optical waveguide fabrication process for fully embedded board-

(56) References Cited

OTHER PUBLICATIONS level optical interconnects," IEEE 2008 10th Electronics Packaging Technology Conference (2008 EPTC), 1-7 (Dec. 9-12, 2008).

Tan et al., "Thermal and hydraulic design and characterization of a liquid-cooled 3D silicon module," IEEE 2008 10th Electronics Packaging Technology Conference (2008 EPTC), 350-354 (Dec. 9-12, 2008).

Tang et al., "Fluidic interconnects in integrated liquid cooling systems for 3-D stacked TSV modules," IEEE 2008 10th Electronics Packaging Technology Conference (2008 EPTC), 552-558 (Dec. 9-12, 2008).

Vempati et al., "Development of 3-D silicon die stacked package using flip chip technology with micro bump interconnects," IEEE 2009 Electronic Components and Technology Conference (ECTC 2009), 980-987 (May 26-29, 2009).

Yan et al., "A hermetic chip to chip bonding at low temperature with Cu/In/Sn/Cu joint," IEEE 2008 Electronic Components and Technology Conference (2008 ECTC), 1844-1848 (May 27-30, 2008).

Yu et al., "Development of fine pitch solder microbumps for 3D chip stacking," IEEE 2008 10th Electronics Packaging Technology Conference (2008 EPTC), 387-392 (Dec. 9-12, 2008).

Yu et al., "Electromigration study of 50 μm pitch micro solder bumps using four-point kelvin structure," IEEE 2009 Electronic Components and Technology Conference (ECTC 2009), 930-935 (May 26-29, 2009).

Yu et al., "Fabrication of silicon carriers with TSV electrical interconnections and embedded thermal solutions for high power 3-D packages," IEEE Transactions on Components and Packaging Technologies, 32 (3): 566-571 (Sep. 2009).

Yu et al., "Study of 15 μm pitch solder microbumps for 3D IC integration," IEEE 2009 Electronic Components and Technology Conference (ECTC 2009), 6-10 (May 26-29, 2009).

Yu et al., "The role of Ni buffer layer between InSn Solder and Cu Metallization for hermetic wafer bonding," IEEE 2008 International Conference on Electronic Materials and Packaging (2008 EMAP), 171-174 (Oct. 22-24, 2008).

Yu et al., "Three dimensional interconnects with high aspect ratio TSVs and fine pitch solder microbumps," IEEE 2009 Electronic Components and Technology Conference (ECTC 2009), 350-354 (May 26-29, 2009).

Yu et al., "Wafer level hermetic bonding using Sn/In and Cu/Ti/Au metallization," IEEE 2008 10th Electronics Packaging Technology Conference (2008 EPTC), 767-772 (Dec. 9-12, 2008).

Yu et al., "Wafer-level hermetic bonding using Sn/In and Cu/Ti/Au metallization," IEEE Transactions on Components and Packaging Technologies, 32 (4): 926-934 (Dec. 2009).

Zhang et al., "Application of piezoresistive stress sensors in ultra thin device handling and characterization," Sensors and Actuators A: Physical, 156: 2-7 (2009).

Zhang et al., "Development of Through Silicon Via (TSV) interposer technology for large die (21x21mm) finepitch Cu/low-k FCBGA package," IEEE 2009 Electronic Components and Technology Conference (ECTC 2009), 305-312 (May 26-29, 2009).

\* cited by examiner

APPARATUS HAVING AN EMBEDDED 3D HYBRID INTEGRATION FOR OPTOELECTRONIC INTERCONNECTS

CROSS-REFERENCE TO RELATED APPLICATION

This patent application claims the benefit of U.S. Provisional Patent Application No. 61/202,348, filed Feb. 20, 2009, which is incorporated by reference in its entirety.

TECHNICAL FIELD

The present invention relates in general to integrated circuits (ICs) for optoelectronic interconnects and in particular to embedded chip-to-chip optical interconnect in a 3D system in package (SiP) format.

BACKGROUND OF THE INVENTION

The advanced fabrication techniques are driving the electronic products to an ever smaller scale, making them more compact and complex. On the other hand, as the integrated circuit (IC) technology advances, the requirement on transmission speed between circuit components increases tremendously. Optoelectronic interconnects are an attractive solution to the bandwidth limitation of data transmissions for board level interconnections. A typical integrated optical-electrical circuit includes a laser source in the transmitter, a photo detector in the receiver, and an optical waveguide connecting the transmitter and receiver. The optical waveguide is a physical structure including transmission medium, such as optical fibers, that transmits and guides light signals from the transmitter to the receiver.

The speed, date rate, power, and size of optoelectronic devices generally scale with the wavelength of the light signals. Nowadays, the complexity of two-dimensional (2D) photonic modules is limited by their substrate sizes and the difficulty in connecting large numbers of electrical connections. Also, the high-profile of these packages prevents them from usage in many applications, e.g., portable electronics products. The 2D system on chip (SoC) technique can reduce the size and increase the performance, but limits the flexibility and posts challenges on fabrication process. For example, during the fabrication process, different materials, e.g., Si and GaAs, must be combined on the same chip.

On the other hand, three-dimensional (3D) IC techniques allow a better integration of devices with different materials and achieves a dramatic cost and labor reduction. A 3D integrated circuit includes two or more layers of active electronic components, integrated both vertically and horizontally into a single circuit. Novel combinations of materials/geometries allow for devices far superior than their 2D in-plane counterparts. Additional flexibility can be achieved in package design, interconnect routing, and package placement through 3D bare-chip integrations.

In "SMT-compatible large-tolerance 'OptoBump' interface for interchip optical interconnections," IEEE Transactions on Advanced Packaging, Vol. 26, No. 2, May, 2003, Ishii et al. lay open an "OptoBump" interface for inter-chip optical interconnections having an embedded optical polymer waveguide. However, the optical chips are packaged in a 2D thick module, and thus large holes on the PCB are required. Because the optical and electrical ICs are packaged in a module at a large distance from the waveguide, the system requires collimating or focusing lenses on the electrical modules and on the PCB, resulting in poor electrical and optical performance and higher costs. In addition, the high-profile design restricts its implementation in many portable products.

In U.S. Patent Application Publication No. 2005/0089264, Johnson et al. lay open an optoelectronic card and PCB including a passive alignment between the Vertical Cavity Surface Emitting Laser (VCSEL) devices and waveguides. In there, a self-alignment characteristic or flip chip is utilized during the solder reflow to assemble the VCSELs to the waveguide on the surface of a PCB. In Johnson's system, both the VCSEL and optical waveguide are sitting on top of the PCB, and thus the integration is poor.

In "Terabus: tebrabit/second-class card-level optical interconnect technologies," IEEE Journal of Selected Topic in Quantum Electronics, Vol. 12, No. 5, September/October 2006, Schares et al. lay open an optoelectronic device having a VCSEL and its driver chip (or a photo diode and its receiver chip) supported by a silicon carrier. In there, the optical polymer waveguide and all the circuit components are not embedded, and thus the package is too thick to be useful for most portable products. In addition, because silicon carriers with holes are used to support the chips and optical lenses are required, the material and production costs are inevitably high.

In "300-Gb/s 24-channel bidirectional Si carrier transceiver optochip for board-level interconnects," Proceedings of $58^{th}$ ECTC, Electronic Components and Technology Conference 2008, pp. 238-243, May, 2008, Doany et al. lay open a bidirectional transceiver optochip supported by a silicon carrier, which is attached on a standard plastic ball grid array package. However, in Doany's system, the polymer optical waveguide is not embedded, but on top of the PCB. The optical and electrical ICs are packaged in a carrier with a very long distance to the optical polymer waveguide, thereby requiring collimating or focusing lenses in the package and on the PCB. In addition, the IC components are not integrated in a 3D stack structure, thereby occupying large footprint and rendering the device unsuitable for portable products.

U.S. Pat. No. 7,373,033 to Lu et al. describes a chip-to-chip optical interconnect including a substrate, an optoelectronic die, and a waveguide structure. The substrate includes an optical via passing through the substrate. The optoelectronic die is disposed on the substrate and aligned to optically communicate through the optical via. A waveguide structure is positioned proximate to the substrate and aligned with the optical via to communicate optical signals with the optoelectronic die through the optical via. In there, not all of the electrical and optical chips are embedded and a carrier is used to support the chip, thereby rendering the package too thick to be useful for most portable products. In addition, the electrical and optical chips are not stacked in a 3D IC structure, causing the package to occupy a large footprint as well as compromising the performance.

U.S. Pat. No. 6,243,509 to Chen describes a board level optoelectronic interconnects having an embedded optical polymer waveguide and the optical chips. However, the semiconductor devices in the system are not embedded. The electrical and optical chips are not integrated in a 3D stack structure, thereby causing the package too large to be applied to most portable products and comprising the performance of the device.

As discussed above, in existing 3D optoelectronic devices, the electrical and optical chips are not integrated in the 3D circuit structure, which can be embedded with the optical waveguide. As a result, the footprints of the circuit components are not optimized and the systems do not achieve the optimal performance. As the trend towards miniature and faster electronic products continues, innovative structures and fabrication process for improving optoelectronic circuit package and lowering material and fabrication costs are highly desired.

BRIEF SUMMARY OF THE INVENTION

Described herein is an apparatus and system having three-dimensional (3D) IC components embedded in a printed circuit board (PCB) or an organic laminated substrate. The optoelectronic components include a transmitter and receiver with a bare chip design. A bare chip IC is defined as an IC that has been cut out from the wafer and is ready for packaging.

In some embodiments, the system includes a rigid PCB (or a substrate) having an embedded optical polymer waveguide, an embedded transmitter, and an embedded receiver. The transmitter further includes an embedded vertical cavity surface emitted laser (VCSEL), an embedded driver chip, and an embedded serializer. The receiver further includes an embedded photo-diode detector, an embedded tans-impedance amplifier (TIA), and an embedded deserializer.

In a further embodiment, the VCSEL, on the transmitter side, the driver chip, and the serializer chip are 3D stacked, embedded, and then aligned with the mirror on one end of the embedded optical polymer waveguide in the PCB. Similarly, on the receiver side, the photo-diode detector, the TIA chip, and the deserializer chip are 3D stacked, embedded, and then aligned with the mirror on the other end of the embedded optical polymer waveguide in PCB.

In a further embodiment, the system includes embedded heat slugs and a heat spreader for dissipating heat from the transmitter and receiver. The back-side of the driver or serializer and the TIA or deserializer chips is attached to the heat slug and the heat spreader if necessary.

In some alternative embodiments, an optoelectronic apparatus is provided, including a circuit board having a cavity, a waveguide structure embedded in the circuit board for transmitting optical signals, and a laser transmitter for generating the optical signals. The laser transmitter is disposed within the cavity in proximity to the waveguide and the waveguide is aligned with the laser transmitter for receiving the optical signals from the laser transmitter.

In still some alternative embodiments, an optoelectronic apparatus is provided, including a circuit board including a cavity, a waveguide structure embedded in the circuit board for transmitting optical signals, and a laser receiver disposed within the cavity in proximity to the waveguide. The laser receiver is aligned with the waveguide structure for receiving the optical signals through the waveguide structure.

The novel structural design offers optimal solutions for low-cost and high-performance semiconductor circuits with optical devices in wide-bandwidth and low-profile optoelectronic packaging for chip-to-chip optical interconnect applications. Because of the embedded structure, the apparatus and system provide small form factor, low cost and high (optical, electrical, thermal, and mechanical) performances.

DETAILED DESCRIPTION OF THE INVENTION

Figure 1:
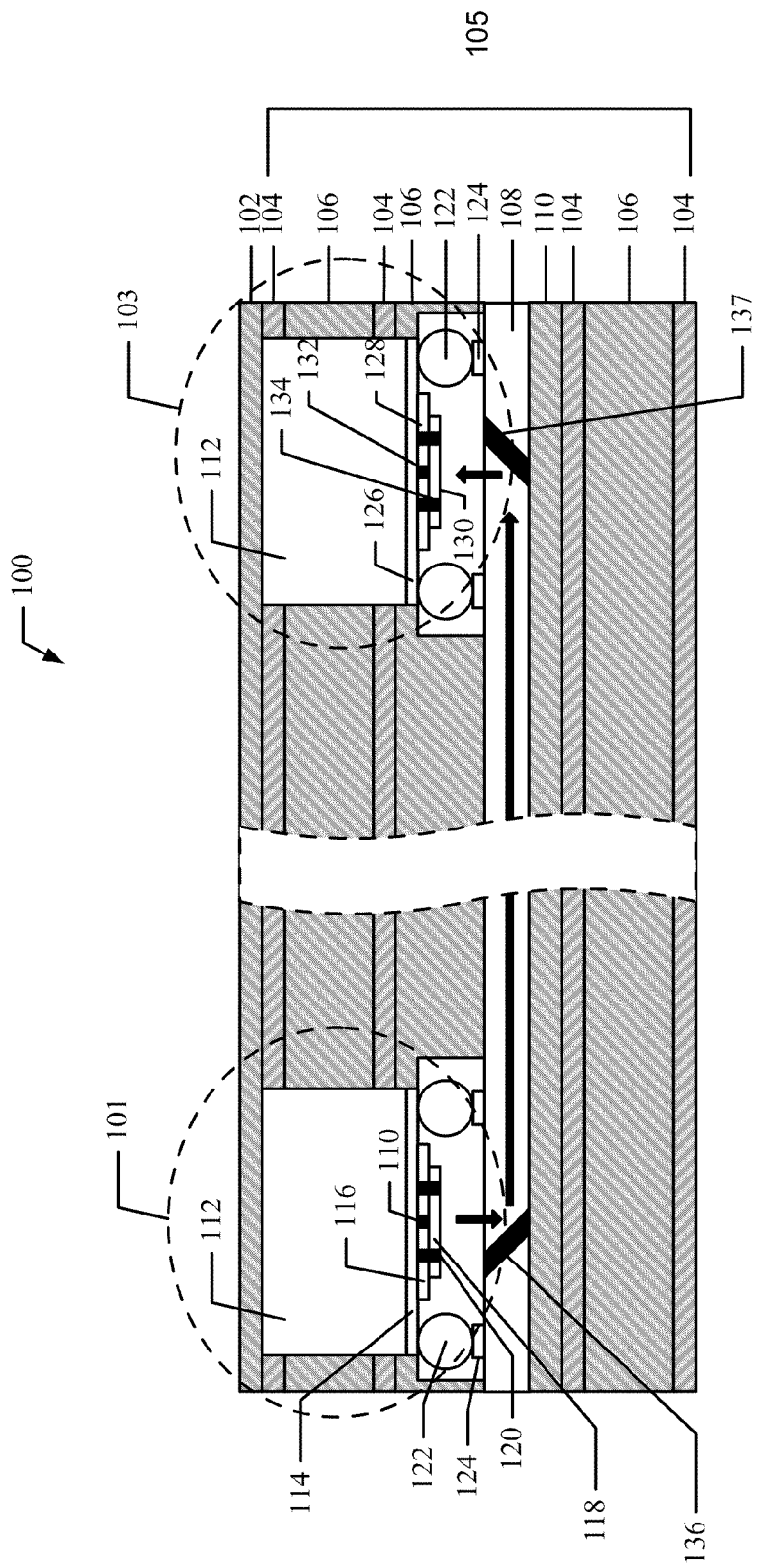
FIG. 1 depicts an optoelectronic apparatus having embedded transmitter and receiver with heat slugs and a heat spreader.
Figure 2:
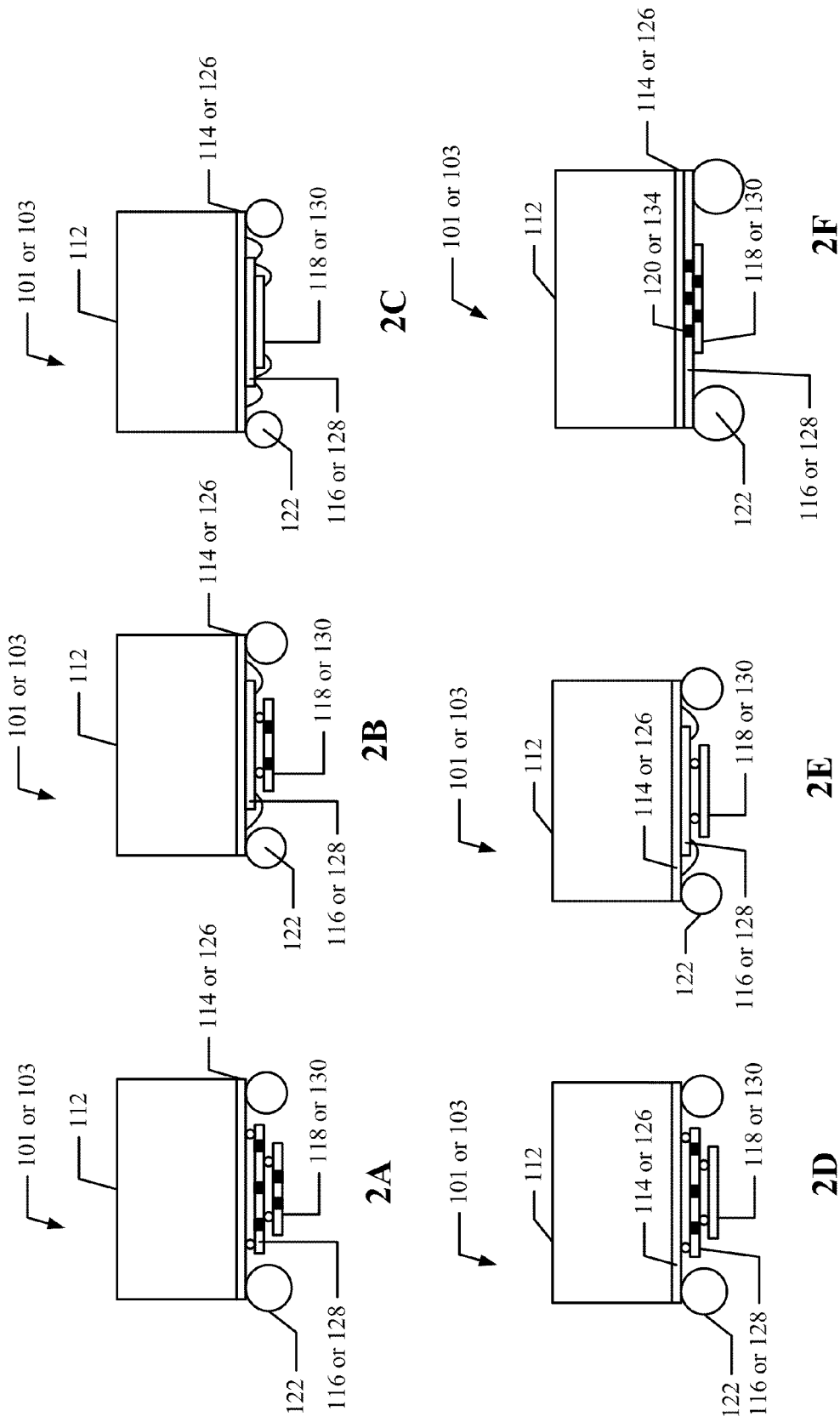
FIGS. 2A-F depict various embodiments of the 3D chip structure for the laser transmitter and receiver.

Now turning to the drawings and referring to FIG. 1, optoelectronic apparatus 100 for providing chip-to-chip optical interconnects is depicted therein. The apparatus 100 includes transmitter 101, receiver 103, and waveguide structure 108, all of which are embedded in printed circuit board (PCB) or suitable substrate 105. The transmitter 101 receives input signals, such as digital or analog signals, and converts the input signals to optical signals, which are transmitted through the waveguide structure 108 to the receiver 103. At the receiver side, the optical signals are converted to output signals for further processing.

Although FIG. 1 depicts the transmitter 101 and the receiver 103 on the same PCB board 105, it is readily understood by one skilled in the art that the transmitter 101 and the receiver 103 can reside on different PCB boards separated at a long distance. In such embodiments, the transmitter 101 and the receiver 103 are interconnected through a long distant waveguide structure 108, and optical amplifiers may be required to ensure reliable transmission of the optical signals.

As shown in FIG. 1, the PCB 105 includes one or more layer of conductive material 104 and one or more layers of insulating material 106 laminated together. The insulating layers 106 can include FR4 material or a BT material. One or more insulating layers 106 forms cavities suitable for enclosing the transmitter 101 and receiver 103, so that the optoelectronic chips can be fully embedded in the PCB 105.

With respect to the transmitter 101, it includes laser generator chip 118, driver chip 116, and serializer chip 114, all integrated in a 3D stack structure. The laser chip 118 can take the form of any semiconductor laser generator such as the Vertical Cavity Surface-Emitting Laser (VCSEL) chips or the Quantum cascade laser chips, that are well known in the art. The driver chip 116 and serializer chip 114 includes standard circuits for processing the incoming signals and driving the laser chip 118 to generate optical signals corresponding to the incoming signals.

In order to reduce the footprint and the dimensions of the transmitter, the laser chip 118 is attached to the driver chip 116 using the flip-chip method as well known in the art. As shown in FIG. 1, when the laser chip 118 has laser emitter on the back side of the chip, the front side of the laser chip 118 is attached to the driver chip 116 so that the emitter faces the mirror 136. In order to provide electronic connections to the laser emitter, one or two through silicon vias (TSVs) are disposed in the laser chip 118.

Alternatively, when the laser chip 118 has laser emitter on the front side (i.e., the active surface) of the chip, the back side of the laser chip 118 is attached to the driver chip 116. In this embodiment, the TSVs in the laser chip 118 is optional.

Similarly, the driver chip 116 is attached to the serializer 114 using the flip-chip method. Accordingly, a plurality of through silicon vias (TSVs) 120 and 110 are disposed in the driver chip 116 in order to provide electronic connections, and a jointing material or underfills, such as a transparent polymer, are then used to secure the jointing interfaces among the chips.

The TSVs in the chips can be filled with various metals including cooper, gold, silver, etc. Detailed teaching of through silicon via is found in Khan et al. "3D packaging with through silicon via (TSV) for electrical and fluidic interconnections," Proceedings of Electronic Components and Technology Conference 2009, pages 1153-1158, May-June, 2009, and Zhang et al. "Development of through silicon via (TSV) interposer technology for large die (21×21 mm) fine-pitch Cu/low-k FCBGA package," Proceedings of Electronic Components and Technology Conference, pages 305-312, May-June, 2009, which are hereby incorporated by reference in their entireties and for everything they include.

With respect to the receiver 103, it includes photo diode detector 130, amplifier chip 128, and deserializer 126, which are stacked in a 3D IC structure as shown in FIG. 1. In particular, the detector 130 and the amplifier chip 128 include TSVs 132 and 134 similar to 120 and 110, for providing electronic connections. The detector 130 is then soldered to the amplifier chip 126 using the flip-chip method and the amplifier 126 is then similarly soldered to the deserializer 128. The jointing materials or underfills are then used to secure the connections in the 3D chip structure. The photo diode detector 130, the amplifier chip 132, and the deserializer 126 also include standard processing circuits for receiving the optical signals form the waveguide structure 108, and convert them into electronic signals for further processing. In particular, the amplifier chip 128 can take the foam of a trans-impedance amplifier.

The stacked chip sets in the transmitter 101 and receiver 103 are encapsulated by special underfills, e.g., transparent polymer.

As further shown in FIG. 1, in order facilitate heat dissipation from the transmitter 101 and receiver 103, the apparatus 100 includes heat slugs 112 attached to the back of the serializer 114 and deserializer 126. On the transmitter side, the PCB 105 includes an opening aligned with the transmitter embedded in the cavity. The opening connects the cavity to the external environment through the outer surface of the PCB 105. A similar opening is disposed within the PCB 105 on the receiver side and aligned with the cavity enclosing the transmitter. The heat slugs 112 are disposed within the opening, abutting the back surfaces of the serializer 114 and deserializer 126. Thermal interface material (TIM) is applied between the chips and the heat slugs 112.

In order to provide additional cooling, the apparatus 100 further includes a heat spreader 102 attached to the outer surface of the PCB 105 and abutting the heat slugs 112. The heat spreader draws heat from the heat slugs 112 and dissipating it into the external environment, thereby providing strengthen cooling effects. The heat slugs 112 and heat spread 102 can be made of any materials that are suitable for conducting heats and are well known in the art.

The waveguide structure 108 includes polymer-based materials that are suitable for optical interconnect due to its low cost, suitability for mass production, high thermal stability and low optical loss. The optical waveguide 108 is embedded in the PCB 105 and supported by an optical layer support film 110 and provides the benefits of low propagation loss, high thermal stability, low fabrication costs, etc. In particular, the typical loss for the waveguide used in optical PCBs, depending on the fabrication process, materials and its cross sectional area, ranges from 0.6 dB/cm to 0.05 dB/cm. Depending on the fabrication processes and materials, polymer-based waveguides have a thermal stability of more than 260° C., which is adequate for lead-free assembly process. In addition, the optical polymer waveguide 108 is usually designed in multi-mode and has a larger aperture for reasons of low cost and compatibility with PCB process.

With respect to the laser source 118, the VCSEL laser chip can provide better laser quality. Unlike edge emitting diodes that emit IR radiation in the plane of the semiconductor, the VCSEL produces a nearly circular beam of symmetrical laser light with low threshold current and small output beam divergence angle that is perpendicular to the plane of the semiconductor. These devices may be constructed on the surface of a fabricated wafer and tested for their optical and electrical properties on the wafer, and have the advantage of combining large 2D emitter arrays and active devices such as CMOS drivers with conventional technology.

Due to the surface emitting characteristic, an out-of-plane 45° reflector (i.e., mirror 136) is provided in the waveguide 108 to reflect the incoming optical signals along the propagation direction. Similar mirror 137 is also provided in the waveguide aligned with the photo detector 130, for receiving the optical signals from the waveguide structure 108. The back sides of the mirrors 136 and 137 are coated with metal such as gold, silver, etc to form the reflective surfaces.

The waveguide structure 108 including the mirrors 136 and 137 and its fabrication is further described in Chang, et al. "Fabrication of fully embedded board-level optical interconnects and optoelectronic printed circuit boards," Proceedings of Electronics Packaging Technology Conference 2009, pages 973-976, December 2009, Lim, et al. "Optimization and characterization of flexible polymeric optical waveguide fabrication process for fully embedded board-level optical interconnects," Proceedings of Electronic Packaging Technology Conference 2008, pages 1114-1120, December, 2008, and Calvin, et al. "Fabrication and optimization of the 45° micro-mirrors for 3-D optical interconnections," Proceedings of Electronic Packaging Technology Conference 2008, pages 1121-1125, December, 2008, which are hereby incorporated by reference in their entireties and for everything they include.

As further depicted in FIG. 1, metal pads 124 are disposed on the surface of the waveguide structure 108 and the transmitter 101 and the receiver 103 are directly attached (soldered) onto the metal pads 124 through solder bumps 122. In some embodiments, the gap between the laser emitter and the waveguide surface and that between the photo detector and the waveguide surface are less than 0.4 millimeter. Because the laser source 118 and the detector 130 are so close to the mirrors 136 and 137 of the optical polymer waveguide 108, the optical lens for converging the optical signals in the conventional systems becomes optional and is not necessary.

According to some alternative embodiments, the 3D chip sets in the transmitter 101 and the receiver 103 can be constructed using various connection methods as shown in FIGS. 2A-F. Specifically, in the transmitter 101, the laser chip 118 can be either flip-chip bumped or wire bonded to the driver chip 116, which can also be either flip-chip bumped or wire bonded to the serializer 114. Similarly, in the receiver 103, the photo detector chip 130 can either flip-chip bumped or wire bonded to the amplifier chip 128, which can be either flip-chip bumped or wire bonded to the deserializer 126.

As depicted in FIG. 2A, when the laser emitter is on the back side of the laser chip 118, the laser chip 118 can be attached to the driver chip 116 using a flip-chip method so that the emitter faces the mirror 136. The driver chip 116 can also be attached to the serializer 116 using the flip-chip method. Here, TSVs are disposed in the driver chip 116 and laser chip 118 for providing electronic connections.

In an another embodiment, shown in FIG. 2B, the laser emitter is on the back side of the laser chip 118, which is flip-chip soldered to the driver chip 116, and the driver chip 116 is wire bonded to the serializer chip 114. In this embodiment, no TSV is needed in the driver chip 116, while one or two TSVs are disposed in the laser chip 118.

In still another embodiment as shown in FIG. 2C, when the laser emitter is on the front side of the laser chip 118, the laser chip 118 can be wire bonded to the driver chip 116, which can then be either flip-chip soldered or wire bonded to the serializer chip 114. In this embodiment, no TSV is needed in either the driver chip 116 or the laser chip 118.

In still another embodiments, as further shown in FIG. 2D, the driver chip 116 is attached to the serializer 114 via flip-chip connections and include a plurality of TSVs. For the laser chip 118, because the active surface (laser emitter) is on the front side of the chip, no TSV is needed when it is flip-chip bumped to the driver chip 116.

As shown in FIG. 2E, no TSV is need in either the driver chip 116 or the laser chip 118 because the driver chip 116 is wire bonded to the serializer 114 and the laser chip 118 has its emitter on the front of the chip.

As further shown in FIG. 2F, the transmitter 101 can be attached to the metal pads on the waveguide structure 108 through driver chip 116, rather than the serializer chip 114. In this embodiment, the solder bumps 112 are applied between the driver chip 116 and the metal pads on the waveguide surface.

As depicted in FIGS. 2A-F, one skilled in the art will appreciate that similar configurations can also be used to construct the receiver 103.

Figure 3:
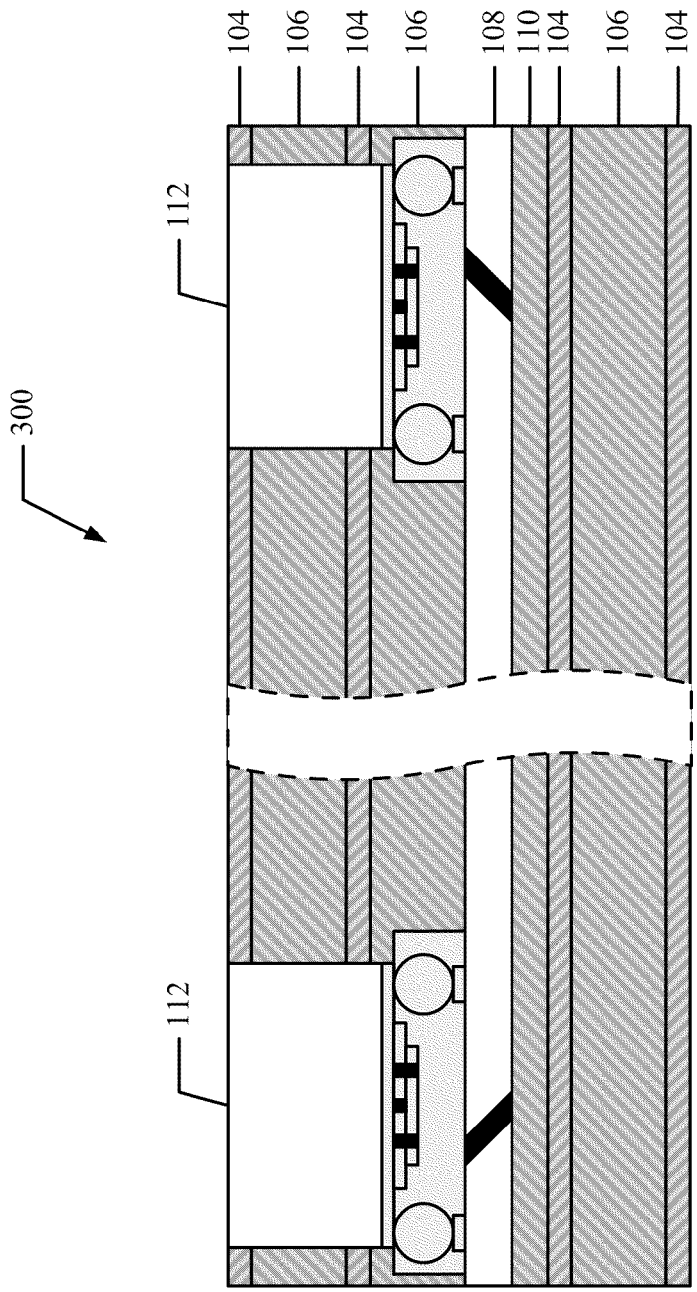
FIG. 3 depicts an optoelectronic apparatus having embedded transmitter and receiver with heat slugs attached to the back of the transmitter and receiver.

As shown in FIG. 3, when the chip sets in the transmitter 101 and receiver 103 are not very large and heat generation is not significant, the heat spreader 102 may not be necessary. Heat is drawn by the heat slugs from the embedded optoelectronic components and dissipated into the external environment.

Figure 4:
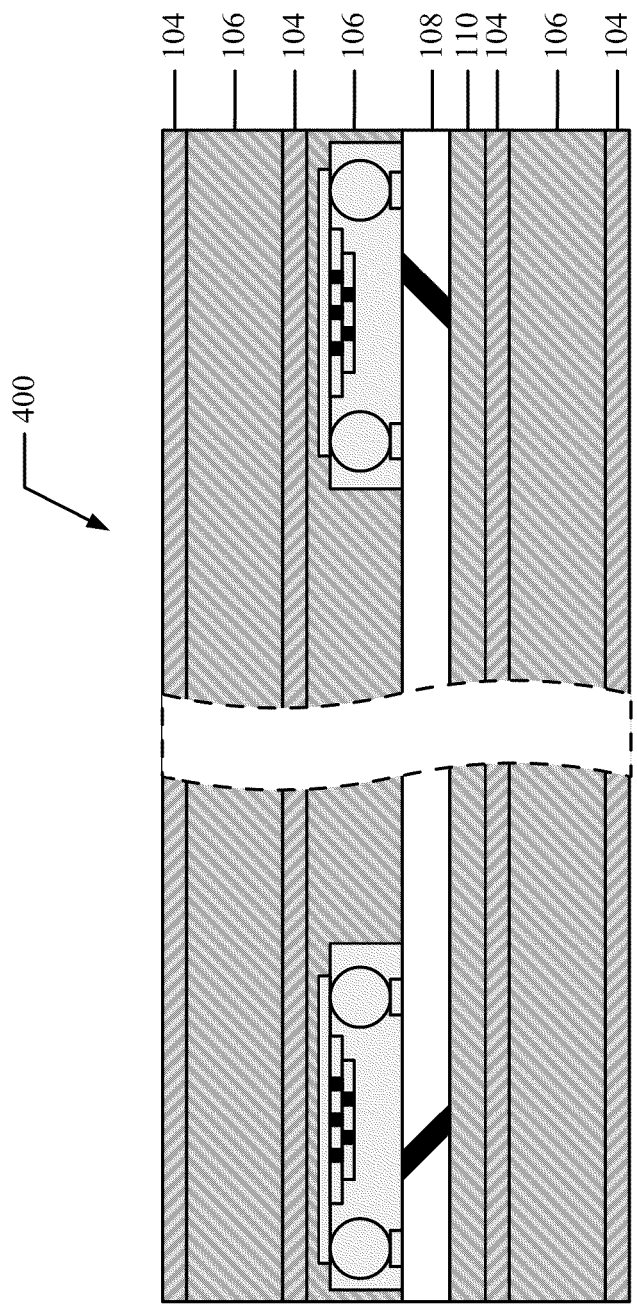
FIG. 4 depicts an optoelectronic apparatus having embedded transmitter and receiver without the heat slugs or the heat spreader.

As shown in FIG. 4, if the heat generation of the embedded chip sets is very small, then the heat slugs 112 and the thermal conductive materials are not even needed. Because the cooling components are unnecessary, the entire system becomes even more compact.

Figure 5:
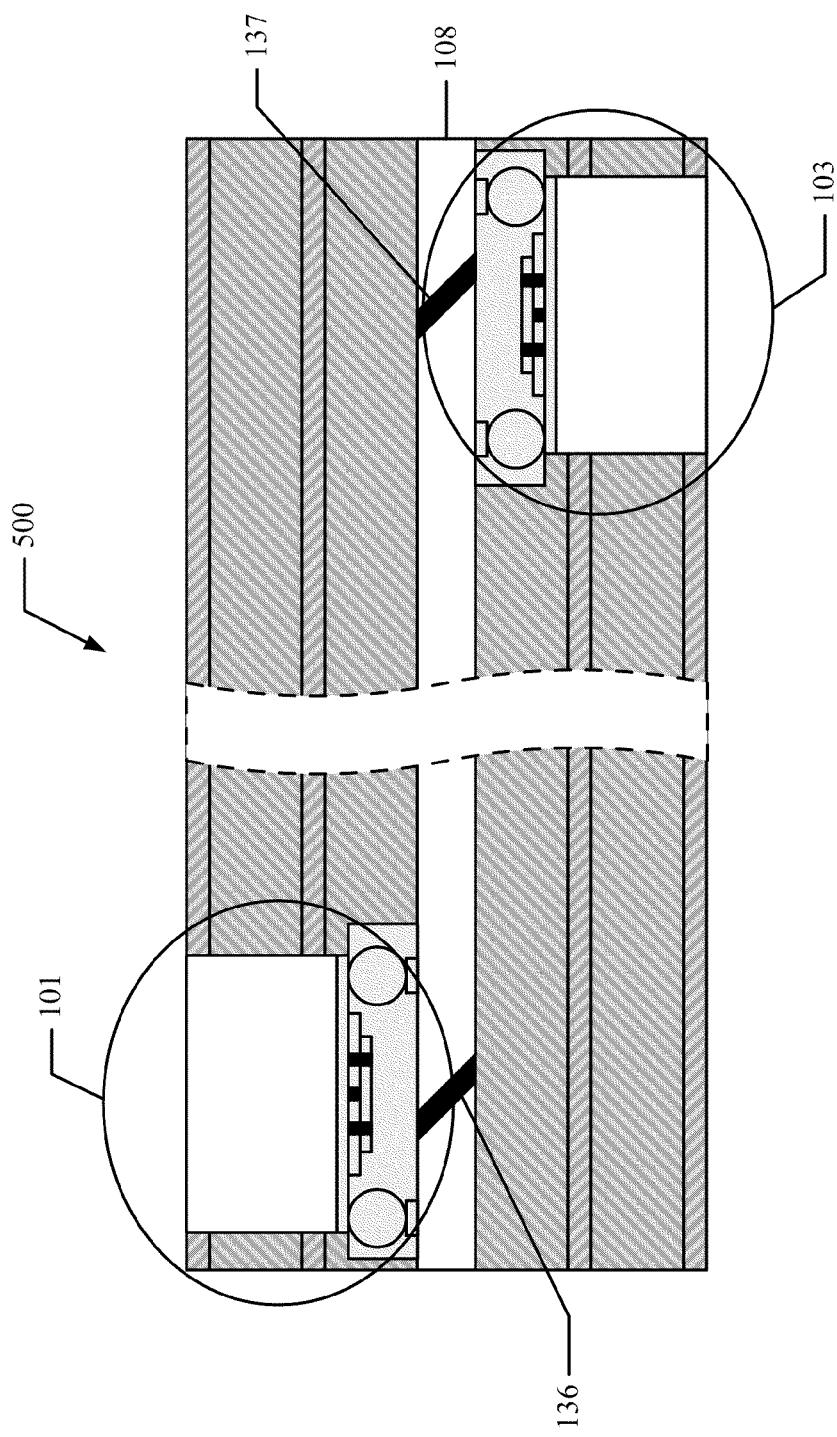
FIG. 5 depicts an optoelectronic apparatus having embedded transmitter and receiver attached on different surfaces of the waveguide.

As further shown in FIG. 5, the transmitter 101 and receivers 103 can be attached to different surfaces of the waveguide structure 108. In this embodiment, the mirrors 136 and 137 are substantially parallel with each other so that the optical signals are correctly transmitted from the transmitter 101 to the receiver 103.

According to still some alternative embodiments, in many applications the serializer chip 114 and deserializer chip 126 may not be needed or can be placed outside the PCB 105. In these embodiments, the embedded transmitter 101 includes only the laser chip 118 and the driver chip 116, and the receiver 103 includes only the detector chip 130 and the amplifier 128, stacked together and enclosed in the PCB cavities. In these embodiments, if cooling is needed, the heat slugs 112 can be attached to the driver chip 116 and the amplifier chip 128.

Figure 6:
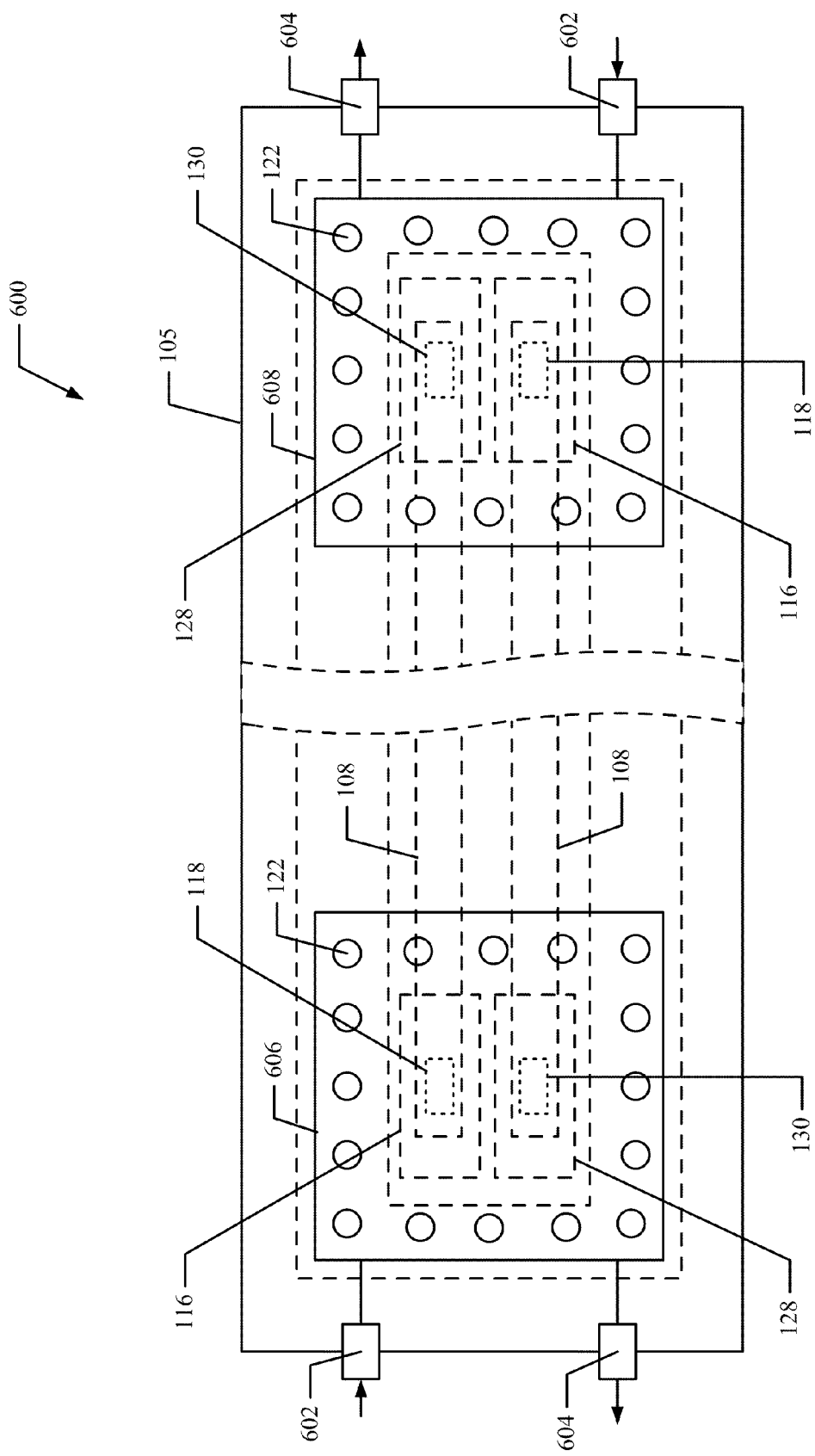
FIG. 6 depicts an optoelectronic apparatus having transmitter and receiver integrated in a transceiver attached to each end of the waveguide.

According to still anther embodiment as shown in FIG. 6, the transmitter 101 and receiver 103 are integrated into transceiver 606 and 608 for providing duplex (bidirectional) communications. In particular, two waveguide structures similarly to waveguide 108 are embedded in the PCB 105. The transceiver 606 and 608 are also embedded into the PCB 105 and aligned with the mirrors (not shown) within the waveguides. In operation, the electronic signals are received through the input ports 602 and converted into the optical signals, which can be transmitted between the transceiver 606 and 608 in both directions. At the receiving ends, the optical signals are converted back to the electronic signals and output through the output ports 604.

During the fabrication process, the driver chip 116, with the laser chip 118 attached thereon, is die-attach onto the serializer chip 114 while it is in the wafer format. After the 3D chip set is diced, it is placed on the PCB substrate on top of the polymer waveguide 108. Special encapsulants such as the transparent polymer may be needed to protect the chip set.

Figure 7A:
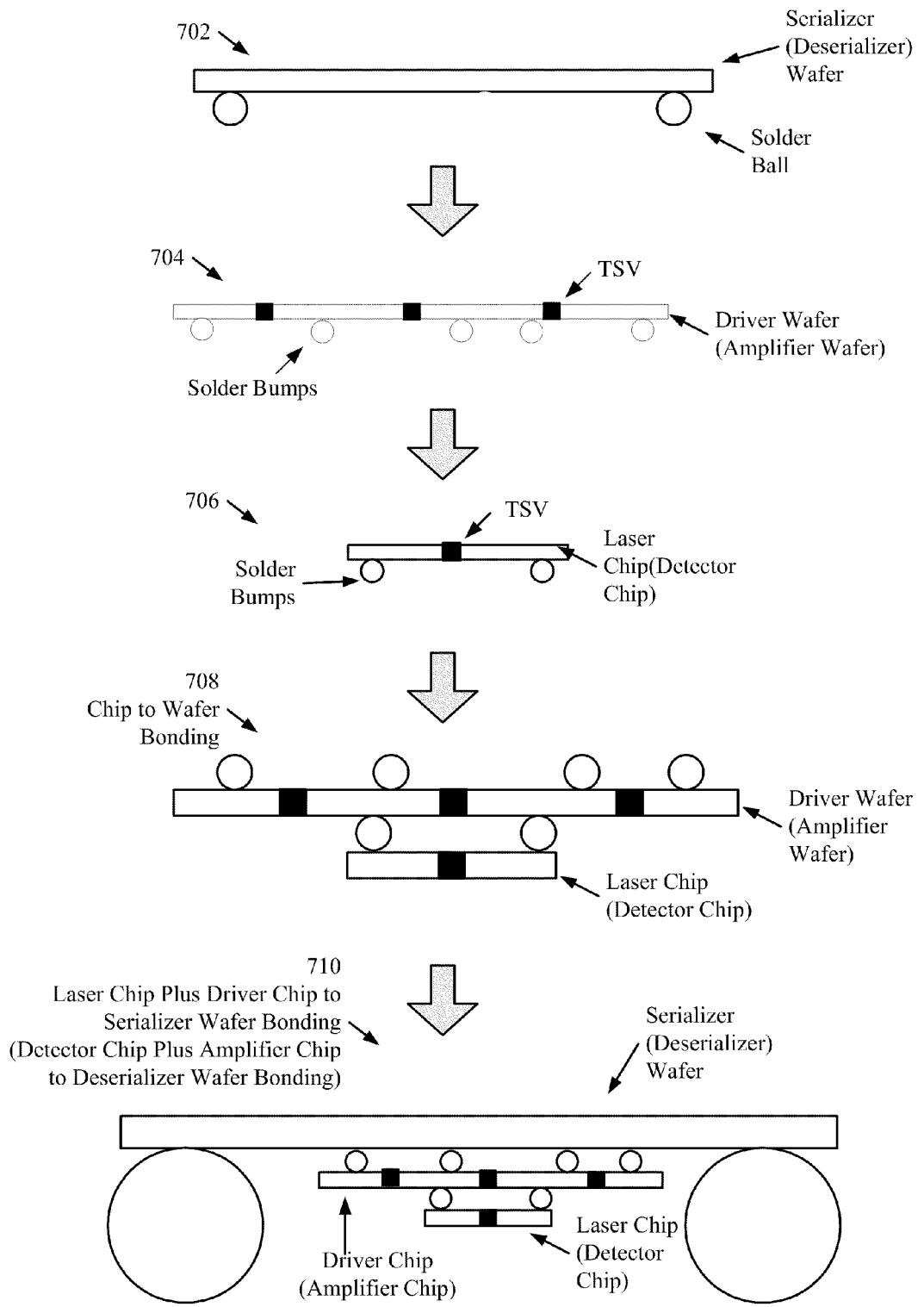
FIGS. 7A and 7B depict a fabrication process for an optoelectronic apparatus.
Figure 7B:
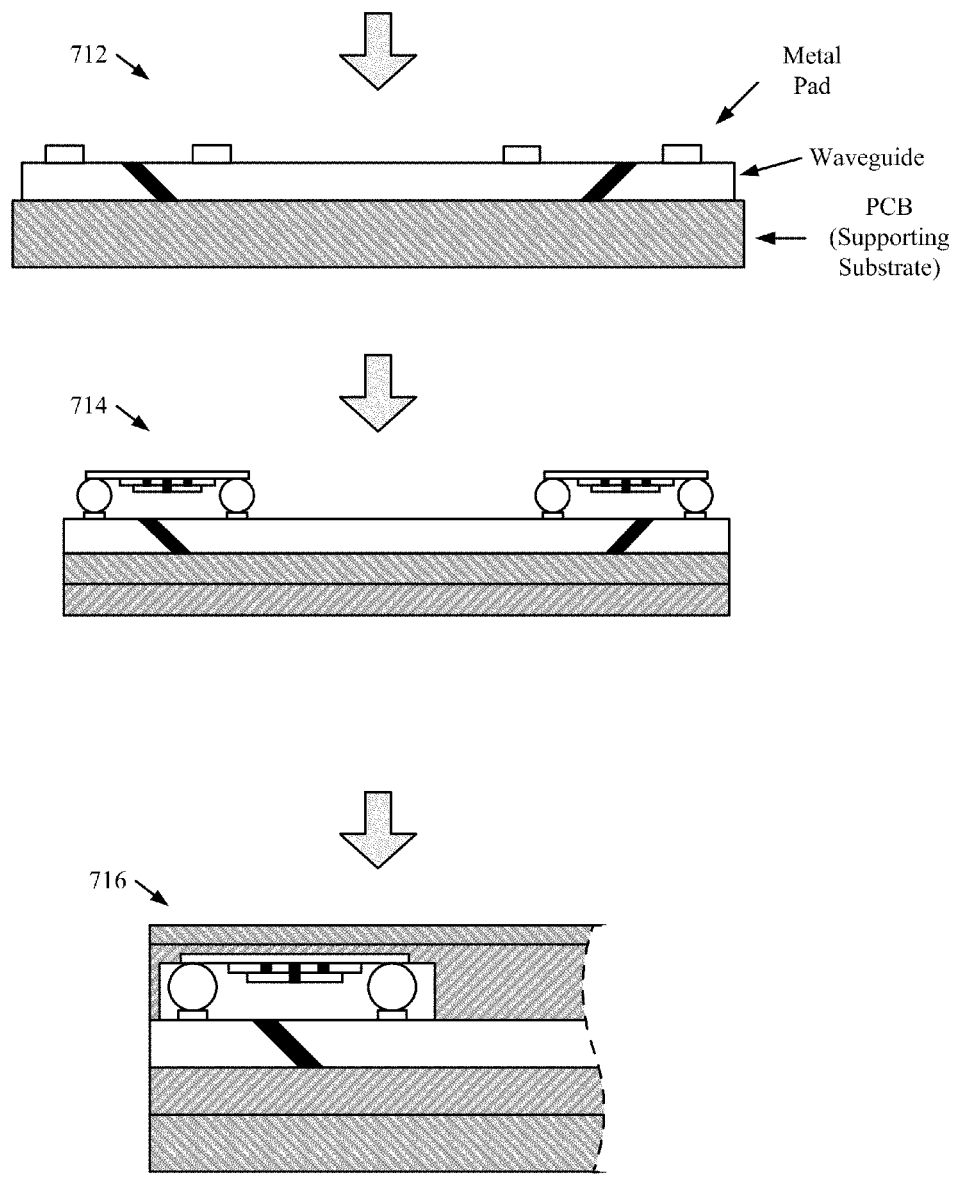

The fabrication of the optoelectronic apparatus 400 depicted in FIG. 4 is further described with respect to FIGS. 7A and 7B. One skilled in the art would appreciate that the fabrication of other embodiments depicted in FIGS. 1-3 and 5-6 are similar.

In particular, at step 702, the serializer 114 and deserializer 126 are fabricated and remain in wafer form. Solder Balls are attached to the serializer and deserializer wafers. At step 704, the driver wafer 116 and the amplifier wafer 128 are fabricated in wafer form. The TSVs are disposed in the driver and amplifier wafers. Solder bumps are then attached to these wafers. At step 706, the laser chip 118 and detector chip 130 are fabricated and the TSVs are disposed in these chips. (When the laser chip 118 uses transparent VCSEL, the TSVs are not needed on the chip.) Similarly, solder bumps are attached to these chips.

At step 708, the laser chip 118 and detector chip 130 are diced and soldered to the wafers of the driver chip 116 and amplifier chip 128, respectively.

At step 710, the driver chip 116 and amplifier chip 128 are diced and attached to wafers of the serializer chip 114 and deserializer chip 126. The serializer and deserializer are then diced to obtain the individual chip set assembly.

At step 712, the waveguide 108 is disposed and attached to the supporting layer on a bottom portion of the PCB substrate. Metal pads are disposed onto the waveguide 108. Alignment marks are made on the waveguide surface for aligning the transmitter 101 and receiver 103 with the mirrors 136 and 137, respectively.

At step 714, the chip set assemblies (transmitter 101 and receiver 103) obtained at step 710 are attached and soldered onto the metal pad through the solder balls and aligned with the mirrors. Suitable underfills materials are applied to enclose the chip set assemblies.

At step 716, the top portion of the PCB substrate is attached and laminated with the bottom portion. The top portion of the PCT includes cavities which enclose the transmitter 101 and receiver 103.

If desired, the top portion of the PCB may include openings for accommodating the heat slugs 112 and the heat spreader 102 can be attached to the top portion of the PCB as depicted in FIG. 1.

After reading this specification, one skilled in the art would appreciate that in the various embodiments depicted in FIGS. 1-6, all of the electrical and optical IC circuits are in bare chip form, thereby reducing package and module costs, reducing system weights and system profile and dimensions, enhancing electrical performance. In addition, because all of the 3D chip sets and the optical waveguide are embedded in the PCB, the distances between the chip sets to the waveguide are minimized, thereby maximizing optoelectrical performance of the system. As note above, lenses are unnecessary between the chip sets and the waveguide. Furthermore, if needed, the system can include heat slugs and heat spreaders to dissipate heat from the back-side of the chip sets. The design of the system allows the stacked chip set to be assembled separately prior to attachment to the waveguide in the PCB.

One skilled in the art would also appreciate that optical (the VCSEL and photodiode) and electrical (the laser driver, serializer, amplifier, and deserializer) IC chips integrated in the 3D chip sets can be fabricated using chip-to-wafer assembly and wafer-level redistribution methods. Although only PCB is described in this application, one skilled in the art would appreciate that the PCB can be substitute with organic laminated substrate for the same purpose.

The invention claimed is:

1. An optoelectronic apparatus, comprising:
    a circuit board including a cavity within the circuit board disposed between top and bottom surfaces of the circuit board;
    a waveguide structure embedded in the circuit board for transmitting optical signals; and
    a laser transmitter for generating the optical signals, the laser transmitter comprising a serializer, a laser driver, and a laser generator, wherein the serializer, the laser driver, and the laser generator are in bare chip form, and wherein the serializer, the laser driver, and the laser generator are disposed completely within the cavity and in proximity to the waveguide, wherein the waveguide is aligned with the laser transmitter for receiving the optical signals from the laser transmitter;
    wherein the laser transmitter has a three dimensional integrated circuit structure such that the serializer, the laser driver, and the laser generator are stacked and electronically coupled within the three-dimensional integrated circuit structure.

2. The optoelectronic apparatus of claim 1, wherein the laser driver is arranged between the serializer and the laser generator, and wherein the serializer and the laser generator are electronically coupled through the laser driver.

3. The optoelectronic apparatus of claim 2, wherein the laser driver includes a silicon substrate having a plurality of through silicon vias passing through the silicon substrate, and wherein the serializer and the laser generator are electronically coupled through the plurality of through silicon vias in the laser driver.

4. The optoelectronic apparatus of claim 2, wherein the waveguide structure includes a transparent surface and first and second reflective surfaces.

5. The optoelectronic apparatus of claim 4, wherein the laser transmitter is attached to the transparent surface of the waveguide structure through a plurality of solder bumps between the serializer and the transparent surface, and wherein the laser generator is oriented toward the transparent surface of the waveguide structure.

6. The optoelectronic apparatus of claim 5, wherein the first reflective surface of the waveguide structure is aligned with the laser generator for receiving the optical signals from the laser generator through the transparent surface, and wherein the first reflective surface reflects the optical signals onto the second reflective surface in a direction substantially parallel to the transparent surface.

7. The optoelectronic apparatus of claim 6, wherein the circuit board further includes another cavity, the apparatus further including a laser receiver disposed within the another cavity and aligned with the second reflective surface of the waveguide structure for receiving the optical signals reflected from the second reflective surface.

8. The optoelectronic apparatus of claim 1, wherein the circuit board further includes an opening extending from the cavity through an outer surface of the circuit board.

9. The optoelectronic apparatus of claim 8, wherein the serializer is oriented toward the outer surface of the circuit board and aligned with the opening, the apparatus further including a heat slug disposed within the opening and attached to the serializer for dissipating heat from the serializer toward the outer surface of the circuit board.

10. The optoelectronic apparatus of claim 9, further including a heat spreader attached to the outer surface of the circuit board for further dissipating the heat from the heat slug.

11. The optoelectronic apparatus of claim 1, wherein the laser transmitter generates one or more vertical cavity surface emitting laser (VCSEL) beams for transmission through the waveguide structure.

12. The optoelectronic apparatus of claim 1, wherein the circuit board further includes another cavity, and the optoelectronic apparatus further comprises:
    a laser receiver disposed within the another cavity in proximity to the waveguide, wherein the laser receiver is aligned with the waveguide structure for receiving the optical signals through the waveguide structure.

13. The optoelectronic apparatus of claim 12, wherein the laser receiver further includes a de-serializer, an amplifier, and a photodiode detector, wherein the laser receiver has a three-dimensional integrated circuit structure, and wherein the de-serializer, the amplifier, and the photodiode detector are stacked and electronically coupled within the three-dimensional integrated circuit.

14. The optoelectronic apparatus of claim 13, wherein the amplifier is arranged between the de-serializer and the photodiode detector, wherein the amplifier includes a silicon substrate having a plurality of through silicon vias passing through the silicon substrate, and wherein the de-serializer and the photodiode detector are electronically coupled through the plurality of through silicon vias in the amplifier.

15. The optoelectronic apparatus of claim 14, wherein the waveguide structure includes a transparent surface and first and second reflective surfaces, wherein the optical signals are reflected from the first reflective surface to the second reflective surface in a direction substantially parallel to the transparent surface, and wherein the laser receiver is attached to the transparent surface of the waveguide structure through a plurality of solder bumps between the de-serializer and the transparent surface, and wherein the laser receiver is oriented toward the transparent surface of the waveguide structure.

16. The optoelectronic apparatus of claim 15, wherein the photodiode detector is aligned with the second reflective surface of the waveguide structure for receiving the optical signals reflected from the second reflective surface through the transparent surface.

17. The optoelectronic apparatus of claim 13, wherein the circuit board further includes an opening extending from the another cavity through an outer surface of the circuit board, and wherein the de-serializer is oriented toward the outer surface of the circuit board and aligned with the opening, the apparatus further including a heat slug disposed within the opening and attached to the de-serializer for dissipating heat from the de-serializer toward the outer surface of the circuit board.

18. The optoelectronic apparatus of claim 17, further including a heat spreader attached to the outer surface of the circuit board for further dissipating the heat from the heat slug.

* * * * *